United States Patent
Tran et al.

(10) Patent No.: US 10,283,206 B2
(45) Date of Patent: May 7, 2019

(54) HIGH SPEED SENSING FOR ADVANCED NANOMETER FLASH MEMORY DEVICE

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US); Vipin Tiwari, Dublin, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/792,590

(22) Filed: Oct. 24, 2017

(65) Prior Publication Data

US 2018/0047454 A1  Feb. 15, 2018

Related U.S. Application Data

(62) Division of application No. 13/958,415, filed on Aug. 2, 2013.

(60) Provisional application No. 61/799,970, filed on Mar. 15, 2013.

(51) Int. Cl.

| | |
|---|---|
| *G11C 16/28* | (2006.01) |
| *G11C 16/06* | (2006.01) |
| *H01L 27/11519* | (2017.01) |
| *G11C 16/24* | (2006.01) |
| *G11C 16/00* | (2006.01) |
| *G11C 7/06* | (2006.01) |
| *G11C 7/12* | (2006.01) |
| *G11C 16/26* | (2006.01) |

(52) U.S. Cl.
CPC .............. *G11C 16/28* (2013.01); *G11C 7/062* (2013.01); *G11C 7/067* (2013.01); *G11C 7/12* (2013.01); *G11C 16/00* (2013.01); *G11C 16/06* (2013.01); *G11C 16/24* (2013.01); *G11C 16/26* (2013.01); *H01L 27/11519* (2013.01); *G11C 2207/063* (2013.01)

(58) Field of Classification Search
CPC ........... G11C 7/062; G11C 7/067; G11C 7/12; G11C 16/28
USPC ..................................... 365/185.05
See application file for complete search history.

(56) References Cited

U.S. PATENT DOCUMENTS

| | | | |
|---|---|---|---|
| 5,754,475 A * | 5/1998 | Bill | G11C 11/5621 365/185.2 |
| 7,638,878 B2 | 12/2009 | Aritome | |
| 7,697,365 B2 * | 4/2010 | Tran | G11C 16/28 365/185.27 |
| 7,977,709 B2 | 7/2011 | Tiebout | |

(Continued)

FOREIGN PATENT DOCUMENTS

| | | |
|---|---|---|
| CN | 1870246 A | 11/2006 |
| CN | 101677020 A | 3/2010 |

(Continued)

*Primary Examiner* — Xiaochun L Chen
(74) *Attorney, Agent, or Firm* — DLA Piper LLP US (57) ABSTRACT

Improved flash memory sensing circuits are disclosed. In one embodiment, a sensing circuit comprises a memory data read block, a memory reference block, a differential amplifier, and a precharge circuit. The precharge circuit compensates for parasitic capacitance between a bit line coupled to a selected memory cell and adjacent bit lines.

28 Claims, 13 Drawing Sheets

(56) References Cited

U.S. PATENT DOCUMENTS

| | | | | |
|---|---|---|---|---|
| 8,274,828 B2* | 9/2012 | Wang | ............... | G11C 16/28 365/185.17 |
| 8,605,521 B2* | 12/2013 | Vimercati | ........... | H03F 3/45762 365/189.15 |
| 8,614,507 B2 | 12/2013 | Yoon | | |
| 8,817,554 B2* | 8/2014 | Vimercati | ........... | H03F 3/45762 365/189.15 |
| 8,928,406 B2* | 1/2015 | Albinet | ............... | H03F 3/45636 330/253 |
| 8,976,592 B2 | 3/2015 | Park | | |
| 2002/0024831 A1 | 2/2002 | Yamaguchi | | |
| 2004/0170078 A1 | 9/2004 | Briner | | |
| 2006/0002177 A1 | 1/2006 | Zheng et al. | | |
| 2007/0241378 A1 | 10/2007 | Aritome | | |
| 2008/0304321 A1* | 12/2008 | Kye | ............... | G11C 7/02 365/185.13 |
| 2009/0016106 A1* | 1/2009 | Tran | ............... | G11C 16/28 365/185.05 |
| 2009/0166681 A1 | 7/2009 | Tiebout | | |
| 2011/0121455 A1 | 5/2011 | Yoon | | |
| 2011/0242921 A1 | 10/2011 | Tran et al. | | |
| 2012/0155177 A1* | 6/2012 | Wang | ............... | G11C 16/28 365/185.17 |
| 2012/0287740 A1* | 11/2012 | Vimercati | ........... | H03F 3/45762 365/203 |
| 2013/0279250 A1 | 10/2013 | Park | | |
| 2014/0056089 A1* | 2/2014 | Vimercati | ........... | H03F 3/45762 365/203 |

FOREIGN PATENT DOCUMENTS

| | | |
|---|---|---|
| JP | 2004111478 A | 4/2004 |
| JP | 2004119457 A | 4/2004 |
| KR | 10-0276536 | 9/2000 |
| KR | 10-2010-0033192 | 3/2010 |
| WO | 2007 029990 A1 | 3/2007 |

* cited by examiner

HIGH SPEED SENSING FOR ADVANCED NANOMETER FLASH MEMORY DEVICE

PRIORITY CLAIM

This application is a divisional application of U.S. patent application Ser. No. 13/958,415, filed on Aug. 2, 2013, and titled, "High Speed Sensing For Advanced Nanometer Flash Memory Device," which claims priority under 35 U.S.C. Sections 119 and 120 to U.S. Provisional Patent Application Ser. No. 61/799,970, filed on Mar. 15, 2013, and titled "High Speed Sensing For Advanced Nanometer Flash Memory Device," both of which are incorporated by reference herein.

TECHNICAL FIELD

Improved sensing circuits and improved bit line layouts for advanced nanometer flash memory devices are disclosed.

BACKGROUND OF THE INVENTION

Flash memory cells using a floating gate to store charges thereon and memory arrays of such non-volatile memory cells formed in a semiconductor substrate are well known in the art. Typically, such floating gate memory cells have been of the split gate type, or stacked gate type.

Flash memory devices typically include parallel bit lines, usually contained within the same metal layer within the semiconductor, that are used during the reading and writing operations to select the appropriate memory cell.

Figure 1:
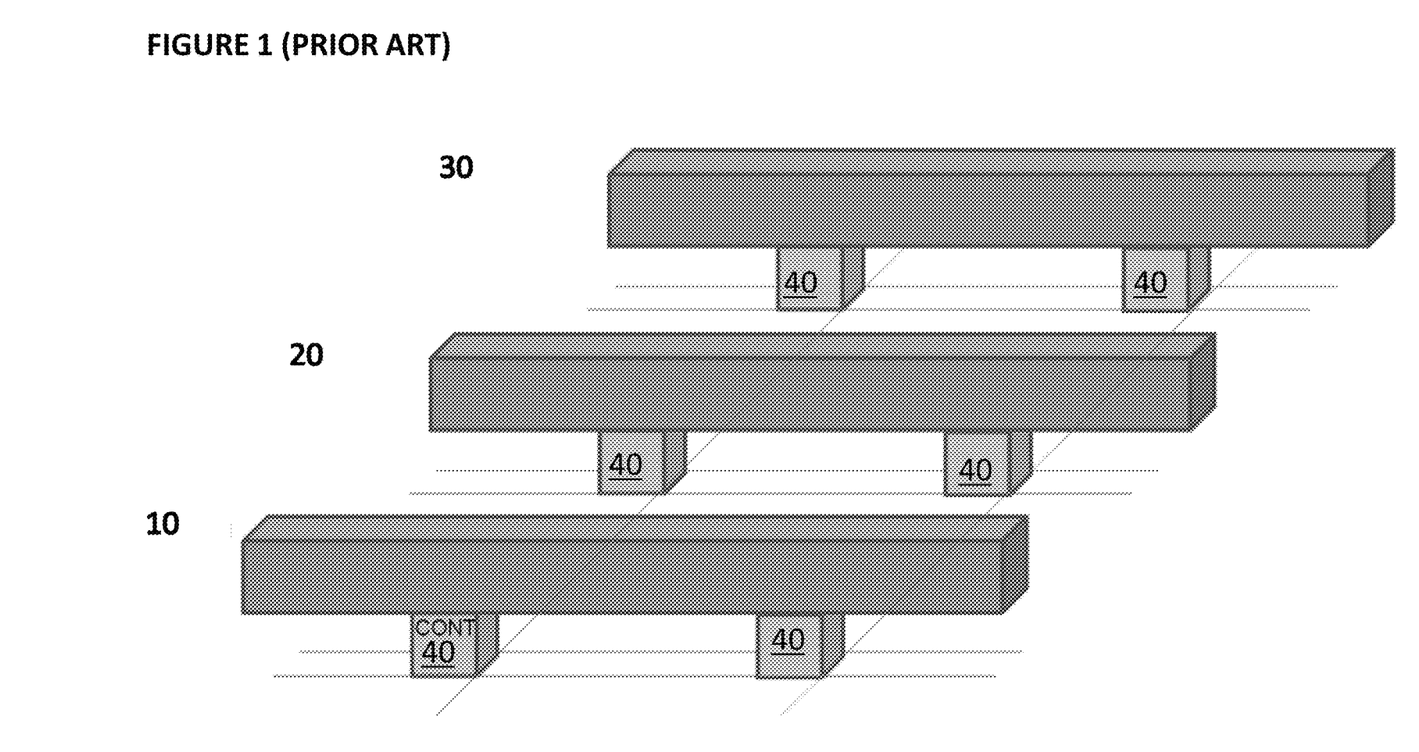
FIG. 1 depicts an elevated side view of a prior art bit line layout.

FIG. 1 depicts a typical prior art configuration. Bit lines 10, 20, and 30 are roughly parallel and in relatively close proximity to one another. Bit lines 10, 20, and 30 typically are fabricated as part of the same metal layer within the semiconductor die. Bit lines 10, 20, and 30 connect to other circuit components through connectors 40.

Figure 2:
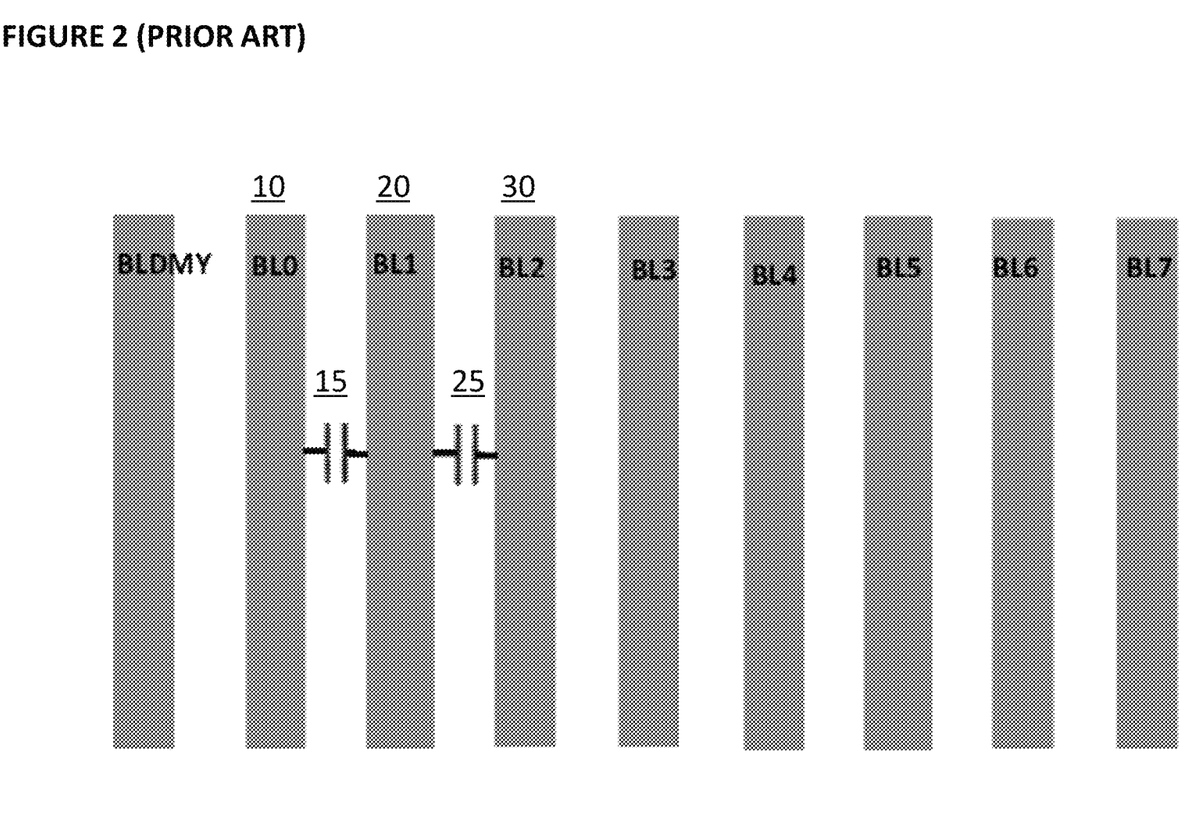
FIG. 2 depicts a top view of the prior art bit line layout of FIG. 1.

FIG. 2 depicts the same prior art configuration from a top view. Again, bit lines 10, 20, and 30 are roughly parallel to one another. Their proximity and length result in parasitic capacitance, which can be modeled as capacitor 15 and capacitor 25.

As flash memory designs become smaller and denser, parasitic capacitance between adjacent bit lines will become more problematic.

What is needed are improved circuit designs that compensate for the parasitic capacitance between bit lines.

What is needed is an improved layout design to reduce the amount of parasitic capacitance in an advanced nanometer flash memory device.

SUMMARY OF THE INVENTION

The aforementioned problems and needs are addressed through an improved circuit design to compensate for parasitic capacitance between adjacent bit lines. In addition, improved layout techniques reduce parasitic capacitance.

DETAILED DESCRIPTION OF THE PREFERRED EMBODIMENTS

Figure 3:
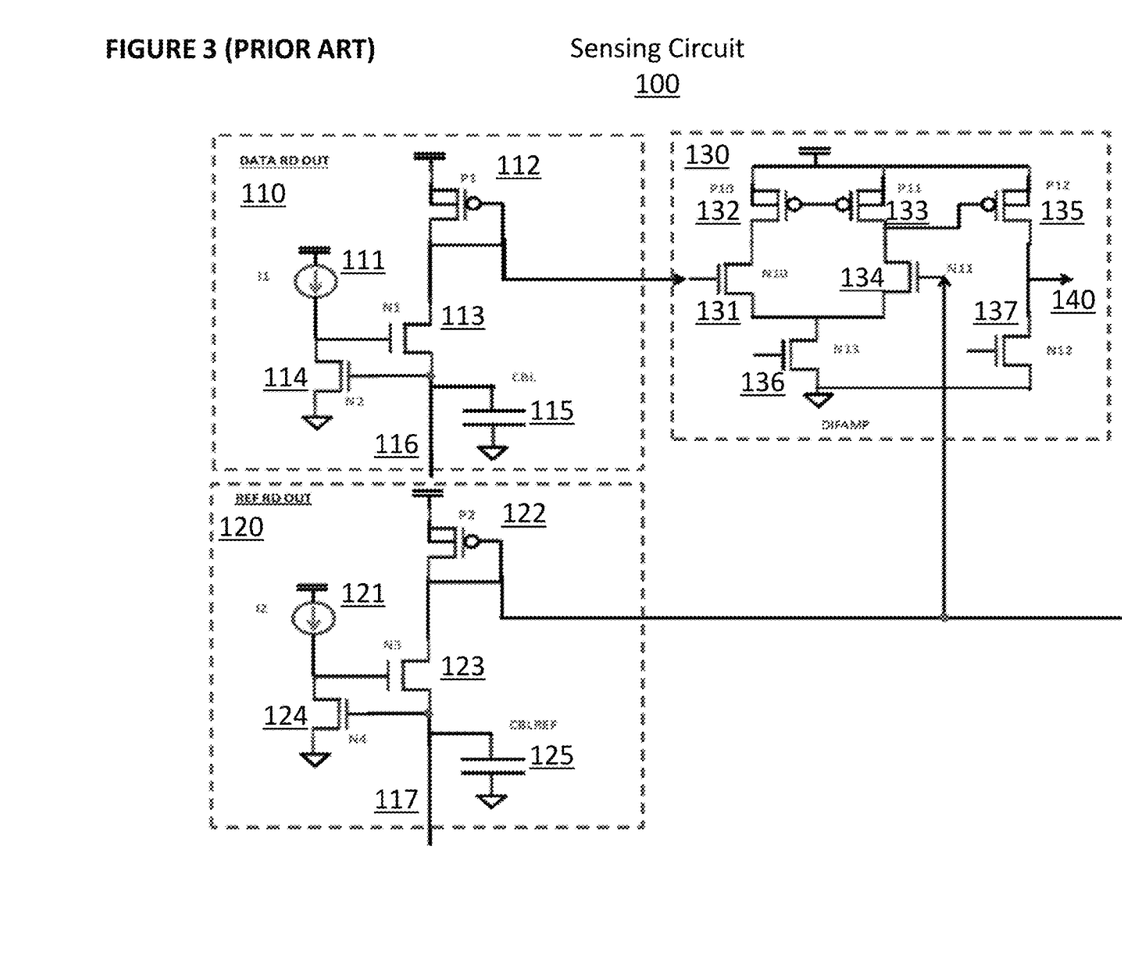
FIG. 3 depicts a prior art sensing circuit.

FIG. 3 depicts a prior art sensing circuit 100. As can be seen in FIG. 3, the prior art design does not model the parasitic capacitance or otherwise take it into account. Sensing circuit 100 comprises memory data read block 110, memory reference read block 120, and differential amplifier block 130. Data read block 110 comprises current source 111, cascoding sensing NMOS transistor 113, bitline clamp NMOS transistor 114, diode connected sensing load PMOS transistor 112, and capacitor 115.

Memory reference read block 120 comprises current source 121, reference bitline clamp NMOS transistor 124, cascoding sensing NMOS transistor 123, and diode connected sensing load PMOS transistor 122, and capacitor 125.

Differential amplifier block 130 comprises input differential pair NMOS transistor 131 and 134, current mirror load PMOS transistor 132 and 133, output PMOS transistor 135, current bias NMOS transistor 136, output current bias NMOS transistor 137, and output 140.

Node 116 is coupled to the selected memory cell (not shown) to be read, and node 117 is coupled to the reference memory cell (not shown) to be used to determine the value of the selected memory cell.

Differential amplifier block 130 is used to compare the signals received from data read block 110 and reference read block 120 to generate output 140 which indicates the value of the data stored in the selected memory cell. These components are connected to one another as shown in FIG. 3.

Figure 4:
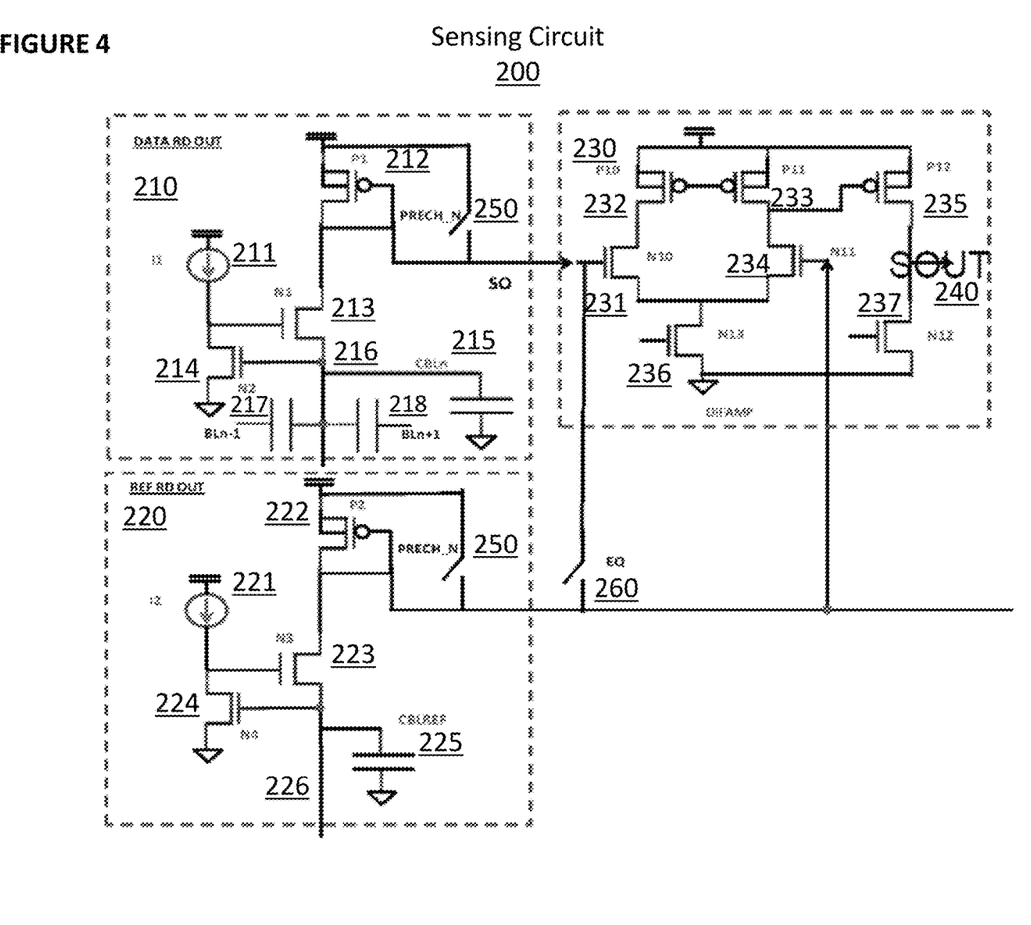
FIG. 4 depicts a sensing circuit embodiment.

FIG. 4 depicts an improved sensing circuit 200. Sensing circuit 200 comprises memory data read block 210, memory reference read block 220, and differential amplifier block 230. Data read block 210 comprises current source 211, cascoding sensing NMOS transistor 213, bitline clamp NMOS transistor 214, diode connected sensing load PMOS transistor 212, and capacitor 215.

Memory reference read block 220 comprises current source 221, reference bitline clamp NMOS transistor 224, cascoding sensing NMOS transistor 223, and diode connected sensing load PMOS transistor 222, and capacitor 225.

Differential amplifier block 230 comprises input differential pair NMOS transistor 231 and 234, current mirror load PMOS transistor 232 and 233, output PMOS transistor 235, current bias NMOS transistor 236, output current bias NMOS transistor 237, and output 240.

Node 216 is coupled to the selected memory cell (not shown) to be read, and node 226 is coupled to the reference memory cell (not shown) to be used to determine the value of the selected memory cell.

Node 216 is the selected bit line and is coupled to capacitor 217 and capacitor 218, which each represents parasitic capacitance from adjacent bit lines, driven to compensate for capacitor 215, precharge switch 250 and equalization switch 260 are selectively turned on. The adjacent bit lines can be driven to a voltage VB, which is less than or equal to the voltage to which the selected bit line is driven. Doing so will reduce the effect of the parasitic capacitance represented by capacitor 217 and capacitor 218.

Differential amplifier block 230 is used to compare the signals received from data read block 210 and reference read block 220 to generate output 240 which indicates the value of the data stored in the selected memory cell. These components are connected to one another as shown in FIG. 4.

Figure 5:
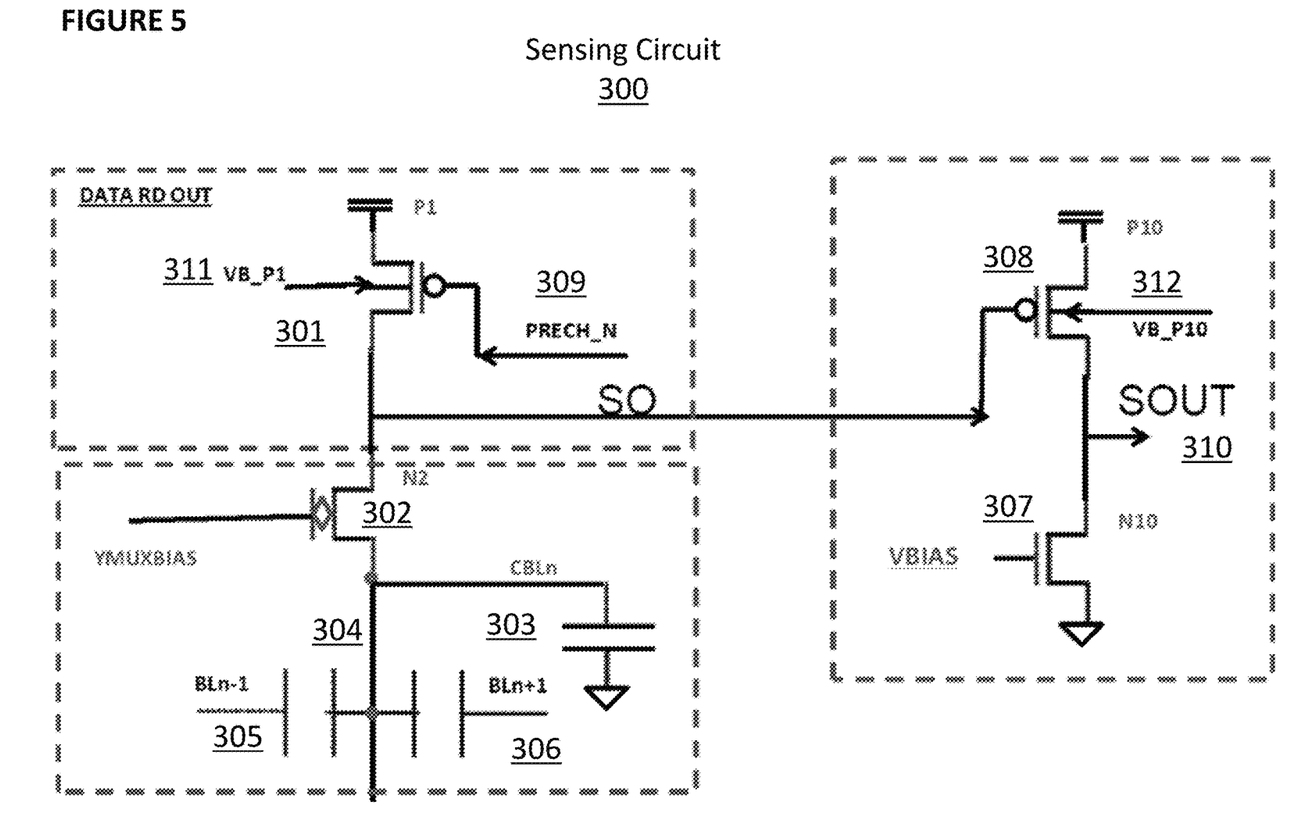
FIG. 5 depicts another sensing circuit embodiment.

FIG. 5 depicts another improved sensing circuit 300. Sensing circuit 300 comprises PMOS transistor 301, cascoding NMOS transistor 302, output PMOS transistor 308, current bias NMOS transistor 307, and output 310. Node 304 is coupled to the selected memory cell (not shown) to be read. The gate of transistor 301 receives pre-charge node voltage 309, which in this example can be 1.2 V or ground. The transistors 307, 308 constitutes single ended amplifier for the output. These components are connected to one another as shown in FIG. 5.

The sensed node (gate of the transistor 308) is precharged to a bias level through the transistor 301 by the pre-charge node voltage 309 being ground. Then the pre-charge node voltage 309 going to a voltage level to release (weakly biased or turn off) the transistor 301. Depending on the state of the memory cell coupled to the node 304, if there is a current (e.g., erase state of the split gate cell described in U.S. Pat. No. 8,072,815, which is incorporated by reference herein and is attached hereto as Appendix A), the sensed node will go down which turns on the transistor 308 to make the output 310 go high. If there is no current (e.g., programmed state of the split gate cell described in U.S. Pat. No. 8,072,815) the sensed node will stay at high which turns off the transistor 308 to make the output 310 go low. This scheme is called reference-less sensing.

The 311 bulk (nwell) substrate terminal of the PMOS transistor 301 and the 312 bulk (nwell) terminal of the PMOS transistor 308 are further forward biased (Vsource voltage–bulk voltage=small positive, e.g. 0.4 v, less than Vp/n forward junction of ~0.6 v) to enhance the threshold voltage (lowered) and high Idsat for lower voltage headroom and higher speed. This bulk techniques could be applied for other figures.

Node 304 is coupled to capacitor 305 and capacitor 306, which each represents parasitic capacitance from an adjacent bit line, driven to compensate for, capacitor 303 connected to node 304.

Figure 6:
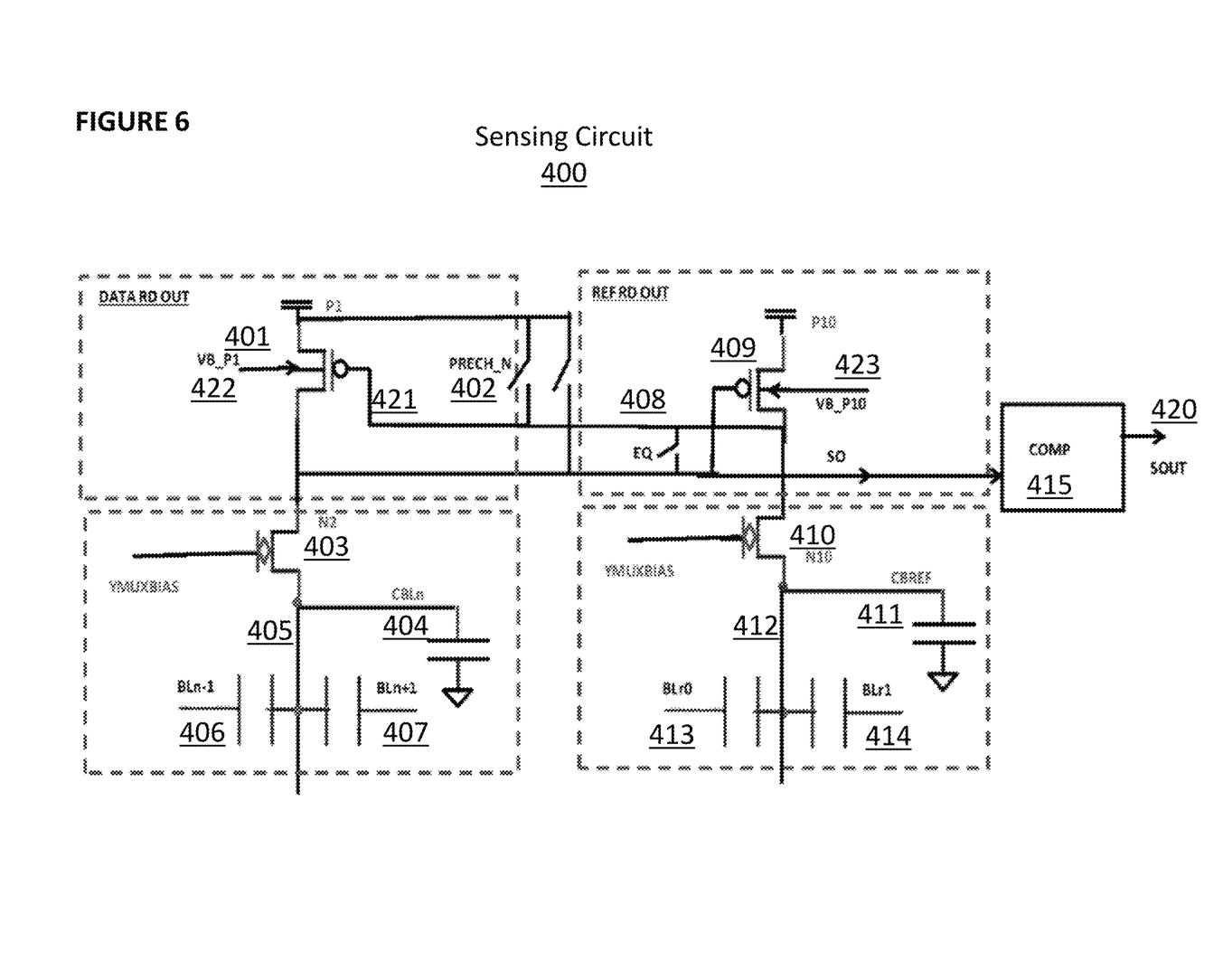
FIG. 6 depicts another sensing circuit embodiment.

FIG. 6 depicts another improved sensing circuit 400. Sensing circuit 400 comprises PMOS transistor 401, cascoding NMOS transistor 403, output PMOS transistor 409, current bias NMOS transistor 410, and output 420. Node 405 is coupled to the selected memory cell (not shown) to be read, and node 412 is coupled to a reference memory cell (not shown).

The gate of transistor 401 receives pre-charge node voltage 421, which in this example can be 1.2 V or ground. The transistors 409, 410 constitutes single ended amplifier for the output. These components are connected to one another as shown in FIG. 6.

The 422 bulk (nwell) substrate terminal of the PMOS transistor 401 and the 423 bulk (nwell) terminal of the PMOS transistor 409 are further forward biased (Vsource voltage–bulk voltage=small positive, e.g. 0.4v, less than Vp/n forward junction of ~0.6 v) to enhance the threshold voltage (lowered) and high Idsat for lower voltage headroom and higher speed. This bulk techniques could be applied for other figures.

Node 405 is coupled to capacitor 406 and capacitor 407, which each represents parasitic capacitance from an adjacent bit line. Node 412 is coupled to capacitor 413 and capacitor 414, which each represents parasitic capacitance from an adjacent bit line, driven to compensate for capacitors 404 and capacitor 411 and switches 402 and 408 are selectively turned on.

Figure 7:
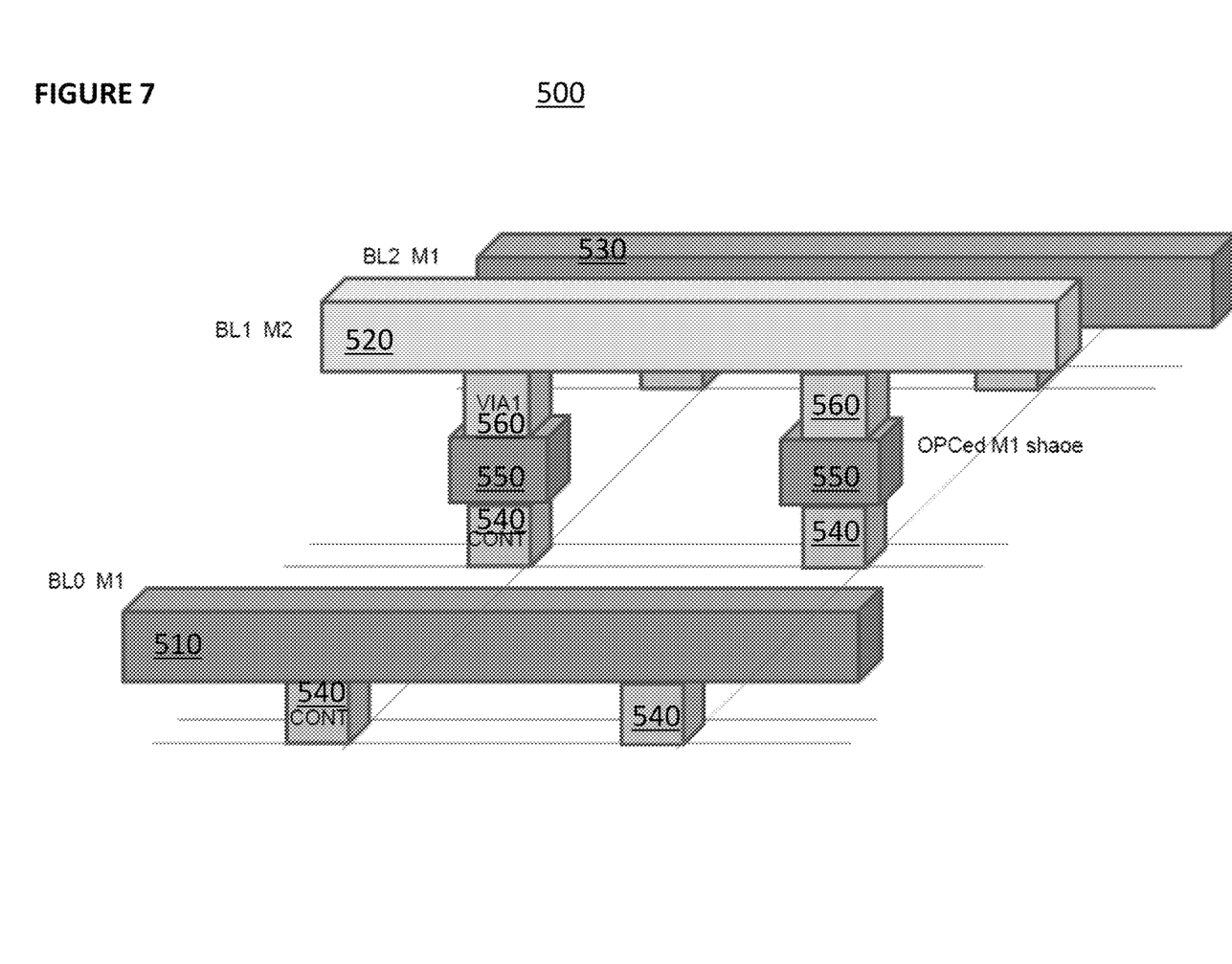
FIG. 7 depicts an elevated side view of an embodiment of a bit line layout.

FIG. 7 depicts an improved layout 500 of bit lines to reduce parasitic capacitance between bit lines. Bit lines 510 and 530 are formed in one metal layer. However, bit line 520 is formed in a different metal layer. Thus, the distance between bit lines 510 and 520 and between bit lines 520 and 530 is longer than would be the case if bit line 520 were formed in the same metal layer as bit lines 510 and 530 as in the prior art. Bit line 520 connects to other circuit components through vias 560, metal 550, and connectors 540. Bit lines 510 and 530 connect to other circuit components through connectors 40.

Figure 8:
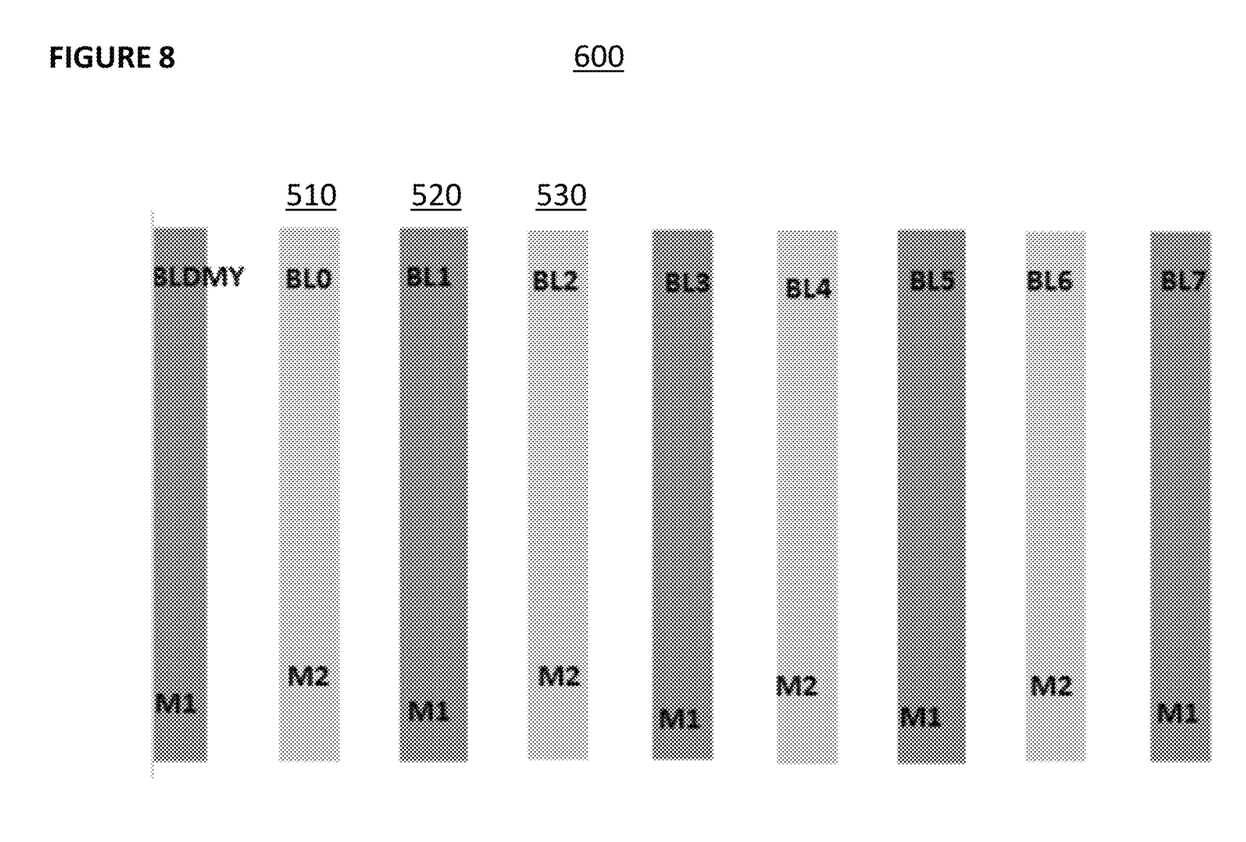
FIG. 8 depicts a top view of the embodiment of FIG. 7.

FIG. 8 depicts the layout of FIG. 7 from a top view. From this view, bit lines 510 and 520 and 530 appear adjacent to one another. However, as indicated by the different shading, bit line 520 and bit lines 510 and 530 are formed in different metal layers.

Figure 9:
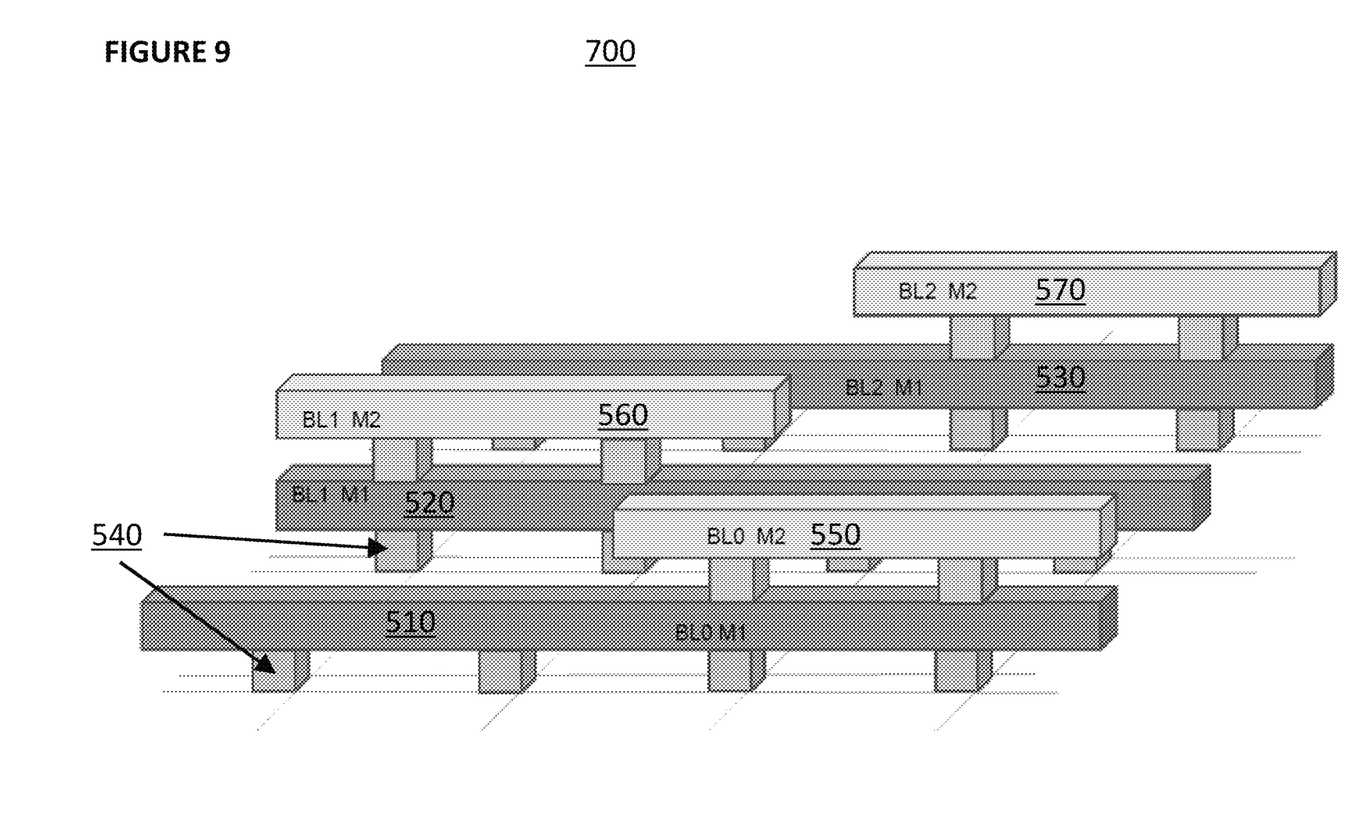
FIG. 9 depicts an elevated side view of an embodiment of a bit line layout.

FIG. 9 depicts an improved layout 700 to reduce resistance of bit lines without increasing parasitic capacitance between bit lines. Here, bit lines 510, 520, and 530 are adjacent, parallel, and formed in the same metal layer as in the prior art configuration. An additional structure 550 is placed above part of bit line 510 in a different metal layer and connects to bit line 510 through connectors 540. Similarly, an additional structure 560 is placed above part of bit line 520 in a different metal layer and connects to bit line 520 through connectors 540, and an additional structure 570 is placed above part of bit line 530 in a different metal layer and connects to bit line 530 through connectors 540. Each additional structure 550, 560, and 570 has the effect of decreasing resistance of the bit line to which it connects but without increasing parasitic capacitance due to the length and placement of each additional structure. Specifically, the additional structures 550, 560, and 570 are placed in a staggered format so that no significant parasitic capacitance is generated among or between them and bit lines 510, 520, and 530.

Figure 10:
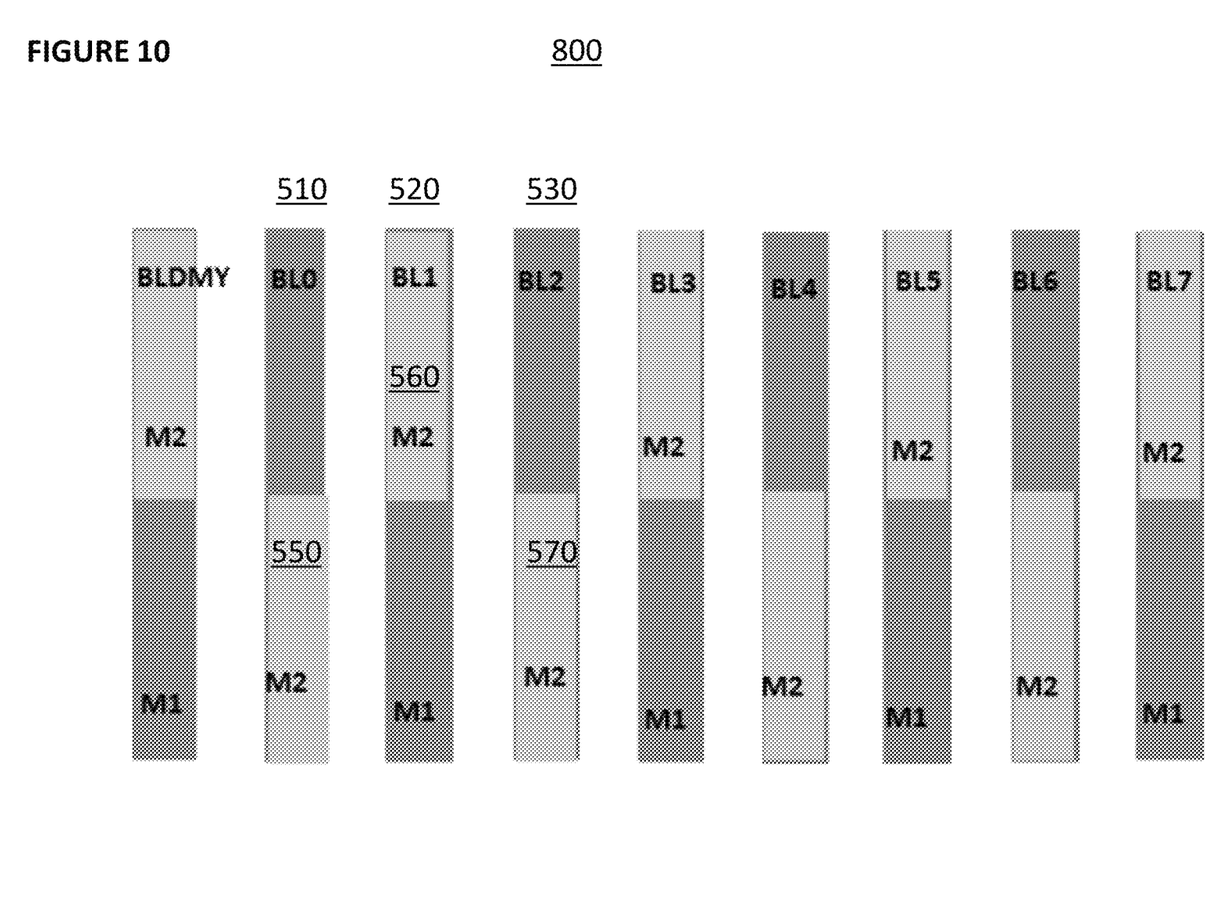
FIG. 10 depicts a top view of the embodiment of FIG. 9.

FIG. 10 depicts the layout of FIG. 9 from a top view. Bit lines 510 and 520 and 530 are adjacent and parallel to one another. The staggered formation of additional structures 550, 560, and 570 is evident in this view.

Figure 11:
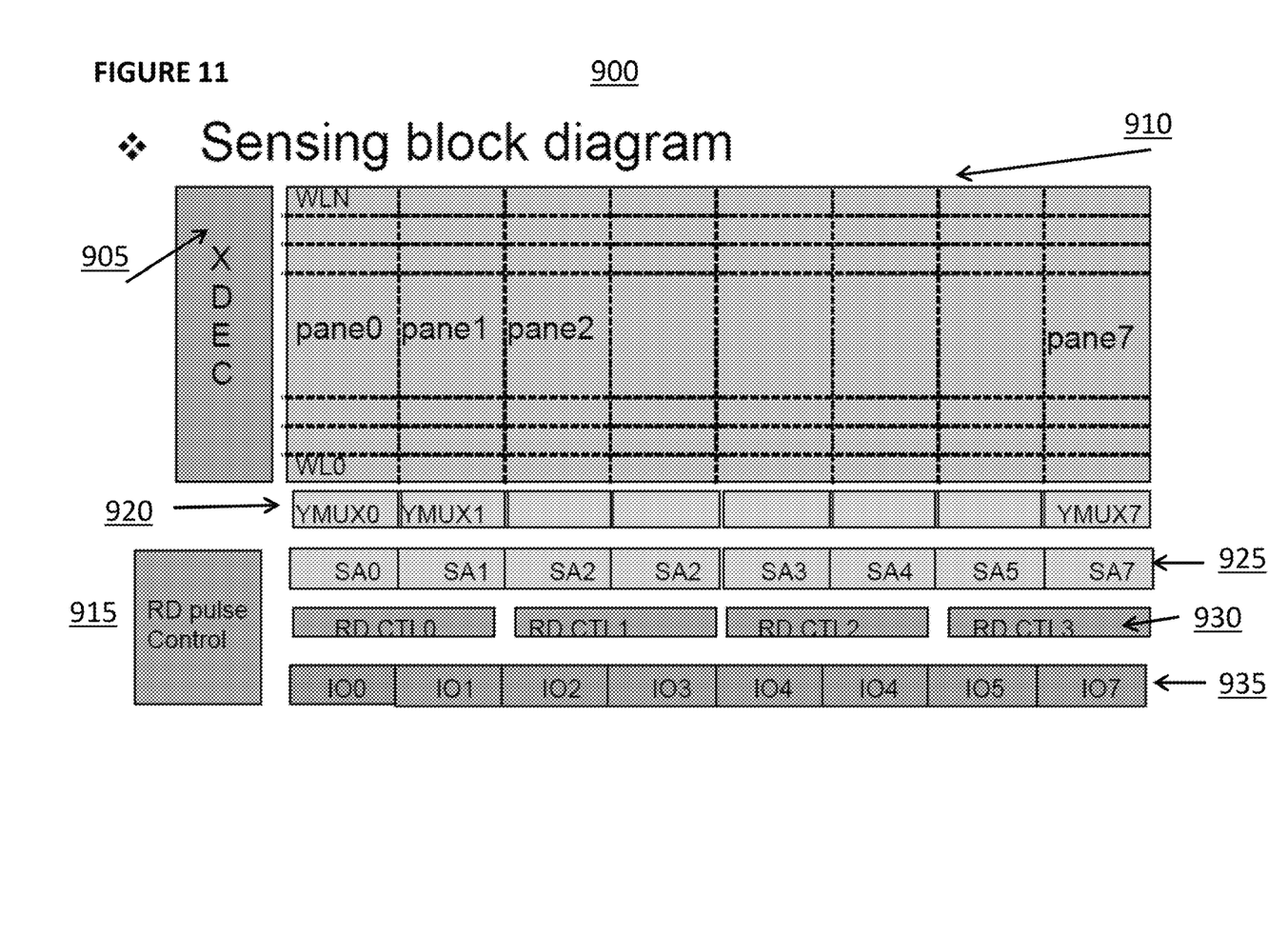
FIG. 11 depicts a sensing block diagram.

FIG. 11 depicts flash memory device 900. Flash memory device 900 comprises: an array of memory cells 910, where the cells are accessed by word lines and bit lines; horizontal decoder 905; vertical decoder 920; read pulse control block 915; read control blocks 930; sense amplifier circuit blocks 925; and IO blocks 935.

Read control blocks 930 are used to generate read timing pulses that track WL position, BL position, and IOwidth and to compensate for PVT.

Figure 12:
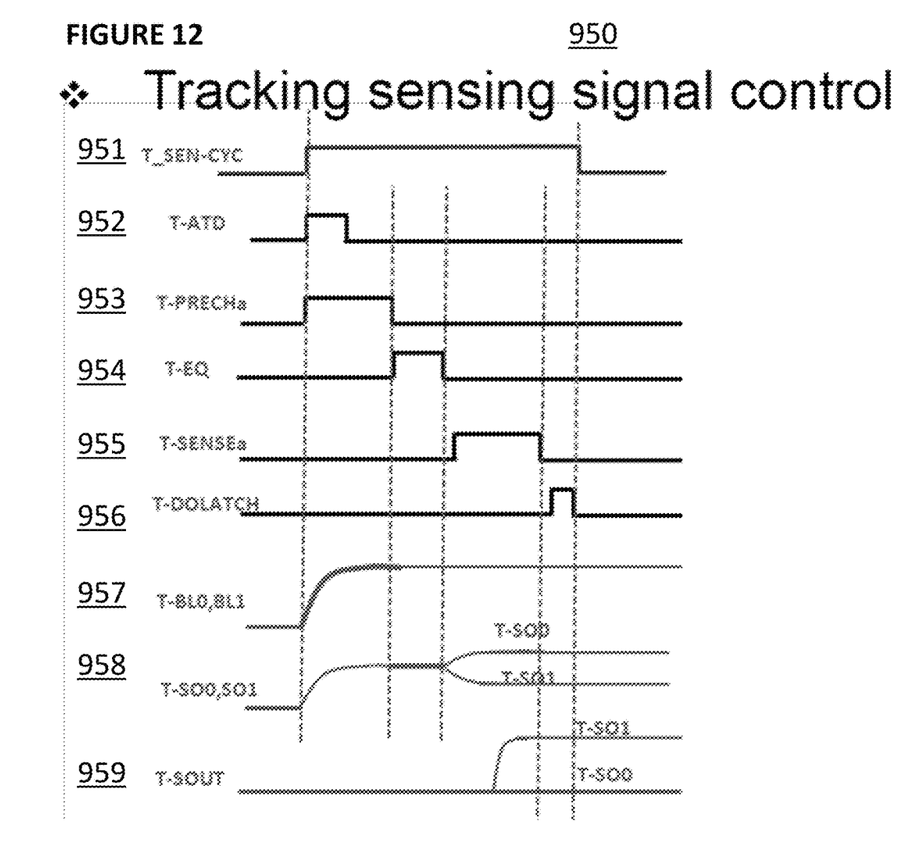
FIG. 12 depicts a timing diagram for tracking sensing signal controls.

FIG. 12 depicts a timing diagram 950 showing the operation of various control signals over time. Signal 951 is the T_SEN-CYC signal, signal 952 is the T-ATD signal, signal 953 is the T-PRECHa signal, signal 954 is the T-EQ signal, signal 955 is the T-SENSEa signal, signal 956 is the T-DOLATCH signal, signal 957 is the T-BL0,BL1 signal, signal 958 is the T-SO0,SO1 signal, signal 959 is the T-SOUT signal.

Signal 953 (T-PRECHa) performs adaptive precharge pulsing. The pulse is shorter at WL0 (location 0 along the wordline) and longer at WL-N (location N along the wordline), and it is shorter at IO0 (location 0 along the IO line) and longer at IO-N (location N along the IO line). Signal 953 (T-PRECHa) tracks the WL delay and BL delay, for example, its pulses are shortest for WL0/BL0.

Signal 955 (T-SENSAa) performs adaptive sensing pulsing. The pulse is shorter at TO0 and longer at IO-N. The pulse is shorter at WL0 and longer at WL-end. It tracks the WL delay and BL delay, for example, its pulses are longest for WL-N/BL-N.

Signal 951(T-SEN-CYC) performs an automatic power down after a sense cycle has completed.

Figure 13:
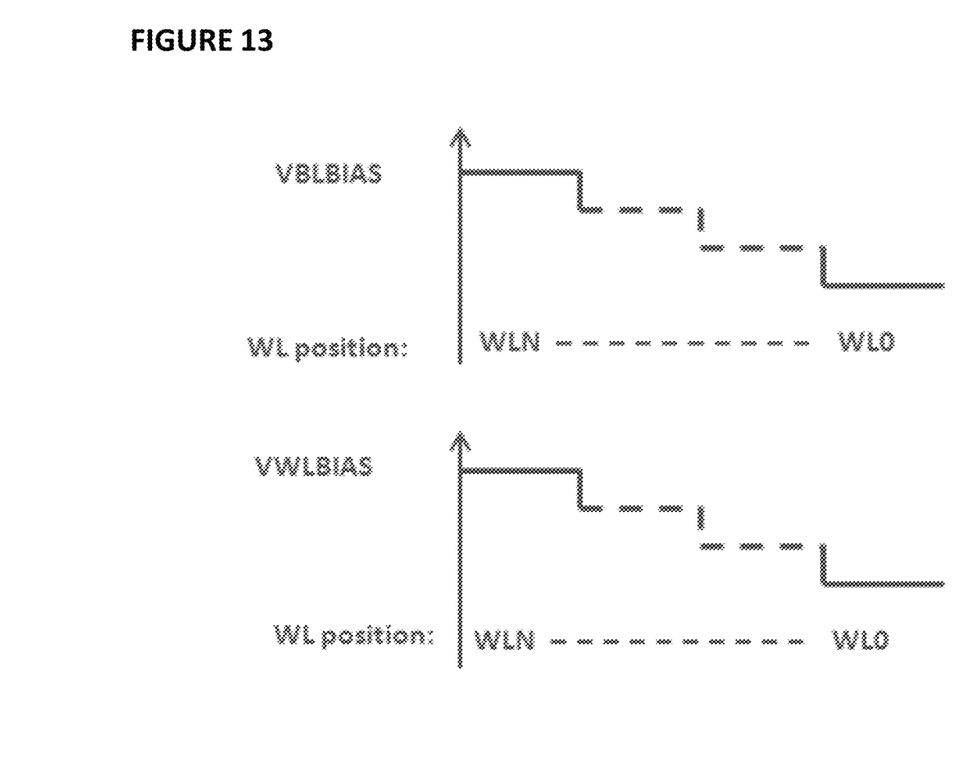
FIG. 13 depicts a graph showing changes in wordline bias and bitline bias based on position along the bitline.

FIG. 13 depicts two graphs. The first graph shows that WL bias is higher at one end of the bitline than the other, and the second graph shows that BL bias is higher at one end of the bitline than the other. This shows the importance of decreasing the resistance of bitlines without increasing the parasitic capacitance between bitlines, as discussed previously with reference to FIGS. 9 and 10.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A flash memory sensing circuit, comprising:
    a memory data read block coupled to a selected flash memory cell and comprising a bit line, a first parasitic capacitor from a first adjacent bit line, a second parasitic capacitor from a second adjacent bit line, and a memory data read block output node;
    a memory reference read block coupled to a reference memory cell and comprising a memory reference read block output node;
    a precharge circuit for precharging the memory data read block output node and the memory reference read block output node to a bias voltage to compensate for the first parasitic capacitor and the second parasitic capacitor, wherein the magnitude of the bias voltage varies based on one or more of the position of the selected flash memory cell within a memory array, the bit line position of the selected flash memory cell within a memory array, or the word line position of the selected flash memory cell within a memory array; and
    a differential amplifier block coupled to the memory data read block output node and the memory reference read block output node for determining a value stored in the selected flash memory cell.

2. The flash memory sensing circuit of claim 1, wherein the memory data read block comprises a current source, a cascoding sensing NMOS transistor, a bitline clamp NMOS transistor, a diode connected sensing load PMOS transistor, and a capacitor.

3. The flash memory sensing circuit of claim 2, wherein the memory reference read block comprises a current source, a reference bitline clamp NMOS transistor, a cascoding sensing NMOS transistor, an a diode connected sensing load PMOS transistor, and a capacitor.

4. The flash memory sensing circuit of claim 1, wherein the differential amplifier block comprises an input differential pair of NMOS transistors, current mirror load PMOS transistors, output PMOS transistor, current bias NMOS transistor, and an output current bias NMOS transistor.

5. The flash memory sensing circuit of claim 1, wherein the precharge control signal varies based on the position of the selected flash memory cell within a memory array.

6. The flash memory sensing circuit of claim 1, wherein the precharge control signal varies based on the bit line position of the selected flash memory cell within a memory array.

7. The flash memory sensing circuit of claim 1, wherein the precharge control signal varies based on the word line position of the selected flash memory cell within a memory array.

8. A flash memory sensing circuit comprising:
    a bit line coupled to a selected flash memory cell;
    a first parasitic capacitor coupled to the bit line and a first adjacent bit line;
    a second parasitic capacitor coupled to the bit line and a second adjacent bit line;
    a precharge circuit coupled to the bit line for precharging the bit line to a bias voltage wherein the magnitude of the bias voltage varies based on one or more of the position of the selected flash memory cell within a memory array, the bit line position of the selected flash memory cell within a memory array, or the word line position of the selected flash memory cell within a memory array; and
    a single ended amplifier comprising a PMOS transistor and an NMOS transistor, wherein a gate of the PMOS transistor is coupled to the bit line and an output of the amplifier indicates the value stored in the selected flash memory cell.

9. The flash memory sensing circuit of claim 8, wherein the output is generated without the use of a reference memory cell.

10. The flash memory sensing circuit of claim 8, wherein the magnitude of the bias voltage varies based on the position of the selected flash memory cell within a memory array.

11. The flash memory sensing circuit of claim 10, wherein the magnitude of the bias voltage varies based on the bit line position of the selected flash memory cell within a memory array.

12. The flash memory sensing circuit of claim 10, wherein the magnitude of the bias voltage varies based on the word line position of the selected flash memory cell within a memory array.

13. The flash memory sensing circuit of claim 8, wherein a bulk of the PMOS transistor is forward biased.

14. The flash memory sensing circuit of claim 8, wherein the precharge circuit comprises a bit line capacitor coupled to the bit line for storing a precharge voltage.

15. The flash memory sensing circuit of claim 9, wherein the precharge circuit comprises a PMOS transistor coupled to a voltage source and the bit line and controlled by a precharge control signal.

16. The flash memory sensing circuit of the claim 14, wherein the magnitude of the precharge voltage varies based on the position of the selected flash memory cell within a memory array.

17. The flash memory sensing circuit of claim 16, wherein the magnitude of the precharge voltage varies based on the bit line position of the selected flash memory cell within a memory array.

18. The flash memory sensing circuit of claim 16, wherein the magnitude of the precharge voltage varies based on the word line position of the selected flash memory cell within a memory array.

19. The flash memory sensing circuit of the claim 15, wherein the precharge control signal varies based on the position of the selected flash memory cell within a memory array.

20. The flash memory sensing circuit of claim 19, wherein the precharge control signal varies based on the bit line position of the selected flash memory cell within a memory array.

21. The flash memory sensing circuit of claim 19, wherein the precharge control signal varies based on the word line position of the selected flash memory cell within a memory array.

22. A flash memory sensing circuit comprising:
a selected bit line coupled to a flash memory cell;
a first parasitic capacitor coupled to the selected bit line and a first adjacent bit line;
a second parasitic capacitor coupled to the bit line and a second adjacent bit line;
a reference line coupled to a reference memory cell;
a third parasitic capacitor coupled to the reference line and a third adjacent bit line;
a fourth parasitic capacitor coupled to the reference line and a fourth adjacent bit line; and
a differential amplifier coupled to the selected bit line and the reference line for determining a value stored in the selected flash memory cell;
wherein the selected bit line and the reference line are coupled to a precharge circuit to compensate for the first parasitic capacitor, the second parasitic capacitor, the third parasitic capacitor, and the fourth parasitic capacitor, wherein the magnitude of the bias voltage varies based on one or more of the position of the selected flash memory cell within a memory array, the bit line position of the selected flash memory cell within a memory array, or the word line position of the selected flash memory cell within a memory array.

23. The flash memory sensing circuit of claim 22, wherein the precharge circuit comprises a bit line capacitor coupled to the selected bit line for storing a precharge voltage and a reference line capacitor coupled to the reference line for storing a precharge voltage.

24. The flash memory sensing circuit of claim 23, wherein the precharge circuit comprises a PMOS transistor coupled to a voltage source and the selected bit line and controlled by a precharge control signal.

25. The flash memory sensing circuit of claim 24, wherein the precharge control signal varies based on the position of the selected flash memory cell within a memory array.

26. The flash memory sensing circuit of claim 25, wherein the precharge control signal varies based on the bit line position of the selected flash memory cell within a memory array.

27. The flash memory sensing circuit of claim 25, wherein the precharge control signal varies based on the word line position of the selected flash memory cell within a memory array.

28. The flash memory sensing circuit of claim 25, wherein a bulk of the PMOS transistor is forward biased.

* * * * *